United States Patent
Ooishi

(10) Patent No.: US 6,385,124 B2
(45) Date of Patent: May 7, 2002

(54) SEMICONDUCTOR DEVICE INCLUDING A MEMORY CELL ARRAY

(75) Inventor: Tsukasa Ooishi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/729,863

(22) Filed: Dec. 6, 2000

Related U.S. Application Data

(62) Division of application No. 08/990,093, filed on Dec. 12, 1997, now Pat. No. 6,191,994.

(30) Foreign Application Priority Data

Aug. 27, 1997 (JP) .............................................. 9-231104

(51) Int. Cl.[7] .................................................. G11C 8/00
(52) U.S. Cl. ............................. 365/230.06; 365/230.03; 365/189.11
(58) Field of Search ...................... 365/230.06, 230.03, 365/189.11, 189.08

(56) References Cited

U.S. PATENT DOCUMENTS

| 5,371,705 A | * | 12/1994 | Nakayama et al. | .... 365/189.09 |
| 5,602,784 A | * | 2/1997 | Kojima et al. | ......... 365/189.09 |
| 5,652,730 A | * | 7/1997 | Kono et al. | .................. 365/226 |

* cited by examiner

*Primary Examiner*—Viet Q. Nguyen
*Assistant Examiner*—Hien Nguyen
(74) *Attorney, Agent, or Firm*—Oblon, Spivak, McClelland, Maier & Neustadt, P.C.

(57) ABSTRACT

Improvement in an operating speed of a semiconductor device reduces power consumption. A current flowing through internal circuits 2A and 2B is supplied, via nodes N5 and N6, by transistors 13 through 20 forming two current mirror circuits as required. A voltage supplied to the internal circuits 2A and 2B is supplied from a transistor 10 via the nodes N5 and N6.

3 Claims, 10 Drawing Sheets

SEMICONDUCTOR DEVICE INCLUDING A MEMORY CELL ARRAY

This Appln is a Div. of Ser. No. 08/990,093 filed Dec. 12, 1997 U.S. Pat. No. 6,191,994.

BACKGROUND OF THE INVENTION

1. Field of the Invention

The present invention is directed to a semiconductor device, especially to a device comprising a dc voltage circuit for generating an internal supply voltage, a device comprising a memory cell array, and a device comprising a plurality of transistors having a SOI structure.

2. Background of the Invention

In order to perform various processes with only one semiconductor chip, there has been a semiconductor device comprising a semiconductor chip on which a plurality of devices are integrated and arranged. Since each of the devices may require a different supply voltage, it becomes necessary to generate an internal supply voltage which is different from an external supply voltage supplied from the outside.

FIG. 12 shows an example of the dc voltage circuit for generating one of the internal supply voltages inside the semiconductor chip. To nodes N1 and N3, different external supply voltages are applied, respectively. The external supply voltage applied to the node N3 includes a ground voltage. A transistor 3 connected to the node N1 supplies the internal supply voltage to an internal circuit 2 formed in a semiconductor chip 1. The output of the transistor 3 is controlled by a differential amplifier 4 so that the internal supply voltage corresponds to a reference voltage Vref. For that reason, in the dc voltage circuit comprised of the transistor 3 and the differential amplifier 4, the reference voltage Vref and the internal supply voltage are applied to an inverting input terminal and a non-inverting input terminal of the differential amplifier 4, respectively, and then the output of the differential amplifier 4 obtained by amplifying the difference in voltage between those terminals is transmitted to the gate of the transistor 3.

Further, for a large distance between the internal circuit 2 and a node N2 to which the internal supply voltage is applied from the dc voltage circuit, parasitic resistance between them causes a voltage drop, making the value of the internal supply voltage to be applied to the internal circuit 2 different from that of the reference voltage Vref. If the dc voltage circuit is formed in the vicinity of the internal circuit 2 to reduce the voltage drop, supply of the reference voltage Vref becomes difficult.

In order to improve processing efficiency, there has been a semiconductor device in which a logic and a memory are integrated on one semiconductor chip. In such a semiconductor device, an external bus would neither affect the processing nor limit the processing speed. A DRAM is one of the most frequently employed memories in such a semiconductor device. Though achieving high integration and low cost, the DRAM requires a boost voltage to be applied to a selected gate of a memory cell. A gate oxide film of a transistor in the memory cell, to which the boost voltage is applied, requires a certain degree of thickness.

FIG. 13 is a graph showing correlation among the external supply voltage supplied to the semiconductor chip from the outside, the boost voltage and the internal supply voltage both generated inside the semiconductor chip. In FIG. 13, the solid line with the reference numeral 31 indicates the internal supply voltage; the solid line with the reference numeral 32 indicates the boost voltage (VPP); the dotted line with the reference numeral 34 indicates a voltage two times the external supply voltage; and the dotted line with the reference numeral 35 indicates a voltage three times the external supply voltage. The internal supply voltage 31 has constantly been increased to obtain the boost voltage VPP.

As described above, in the semiconductor device comprising the conventional dc voltage circuit, the differential amplifier directly drives a gate voltage of the transistor for supplying the internal supply voltage. This increases an output load capacity of the differential amplifier and prevents a high-speed operation of the dc voltage circuit. Thus, when the internal circuit operates at high frequency, the internal supply voltage cannot be stable.

Further, parasitic resistance or the like prevents supply of the desired internal supply voltage to the internal circuit formed in any location in the semiconductor chip.

Moreover, besides the current necessary for charge or discharge of the boost voltage, another current is necessary to generate the boost voltage inside the semiconductor chip, which increases the consumption of current in the whole semiconductor chip.

SUMMARY OF THE INVENTION

A first aspect of the present invention is directed to a semiconductor device comprising: an internal circuit formed in a semiconductor chip connected to first and second power supplies, and inserted in a current path formed between first and second nodes to receive an internal supply voltage via the first node; a first insulated-gate transistor having a control electrode, a first current electrode connected to the first power supply, and a second current electrode connected to the first node; a second insulated-gate transistor having a first current electrode connected to the first current electrode of the first insulated-gate transistor, a control electrode and a second current electrode both connected to the control electrode of the first-insulated type gate transistor; a third insulated-gate transistor having a first current electrode connected to the second power supply, a second current electrode and a control electrode both connected to the second node; a fourth insulated-gate transistor having a control electrode connected to the control electrode of the third insulated-gate transistor, a first current electrode connected to the second power supply, and a second current electrode connected to the second current electrode of the second insulated-gate transistor; and a voltage supply circuit for supplying an internal supply voltage to the first node.

Preferably, according to a second aspect of the present invention, a current flowing through the first and third insulated-gate transistors is greater than that flowing through the second and fourth insulated-gate transistors.

A third aspect of the present invention is directed to a semiconductor device comprising: an internal circuit formed in a semiconductor chip connected to first and second power supplies to receive an internal supply voltage; a first insulated-gate transistor having a control electrode, a second current electrode connected to a node for supplying the internal supply voltage to the internal circuit, and a first current electrode connected to the first power supply; a second insulated-gate transistor having a control electrode connected to the control electrode of the first insulated-gate transistor, a first current electrode connected to the first current electrode of the first insulated-gate transistor, and a second current electrode connected to the control electrode of the first insulated-gate transistor; a third insulated-gate transistor having a control electrode, a first current electrode connected to the second power supply and a second current electrode connected to the second current electrode of the second insulated-gate transistor; and a differential amplifier having an output terminal connected to the control electrode of the third insulated-gate transistor, a non-inverting input terminal connected to the node, and an inverting input terminal to which a reference voltage is applied, wherein a current flowing through the first insulated-gate transistor is greater than that flowing through the second insulated-gate transistor.

Preferably, according to a fourth aspect of the present invention, the semiconductor device further comprises a fourth insulated-gate transistor connected in series between the second power supply and the second current electrode of the third insulated-gate transistor, the fourth insulated gate transistor having a control electrode connected to the output terminal of the differential amplifier.

A fifth aspect of the present invention is directed to a semiconductor device comprising: an internal circuit formed in a semiconductor chip connected to first and second power supplies, the internal circuit receiving a first voltage; a boost circuit capable of generating a second voltage, higher than the first voltage, from the first and second power supplies at a first node connected to the internal circuit; a differential amplifier having a first terminal to which a voltage, obtained by subtracting a predetermined potential difference from a voltage at the first node, is applied, a second terminal to which a reference voltage is applied, and an output terminal for amplifying a potential difference between the first and second terminals; a current control means connected to the output terminal of the differential amplifier as well as connected between the first power supply and the first node, the current control means controlling a current flowing from the first power supply to the first node in accordance with a voltage at the output terminal of the differential amplifier; a current source connected between the first node and the second power supply, the current source supplying a current between the first node and the second power supply; and a control means for turning off the boost circuit when a voltage outputted from the first power supply is higher than the second voltage.

A sixth aspect of the present invention is directed to a semiconductor device comprising: a memory cell array having a plurality of blocks and a plurality of word lines comprised of a plurality of portions divided for each of the plurality of blocks to select memory cells of the plurality of blocks; a row decoder for selecting a row to select the word line; a word line driver provided for each of the plurality of blocks to supply a predetermined voltage to the portion; and a transfer gate provided between each of the plurality of portions to connect the plurality of portions, wherein data is read from or written to a row selected by the row decoder by transferring a charge between the plurality of portions adjacent to each other, in accordance with continuity or non-continuity of the transfer gate for the plurality of blocks in the memory cell array.

A seventh aspect of the present invention is directed to a semiconductor device having an epitaxial layer formed on an insulator. The semiconductor device comprises: a plurality of transistors having an electrode region ranging from the epitaxial layer to the insulator, wherein the electrode regions of transistors, having different conductivity types and adjacent to each other, are formed close to each other, the transistors being included in the plurality of transistors.

In accordance with the semiconductor device of the first aspect, since the internal circuit receives almost the same amount of current with its consuming current from the first and third insulated-gate transistors, supply of current from the voltage supply circuit is almost unnecessary, reducing an error of the supplied voltage. Besides, supply of the reference voltage to the first through fourth insulated-gate transistors is unnecessary, so that the internal circuit for receiving the current from the first through fourth insulated-gate transistors has a wider freedom of location.

In accordance with the semiconductor device of the second aspect, current consumption can be reduced except in the internal circuit.

In accordance with the semiconductor device of the third aspect, the third transistor of a smaller size can reduce a load for driving the differential amplifier. Thus, even if the internal circuit operates at high frequency, the semiconductor device can be performed at high speed by suppressing fluctuation in voltage at the node.

In accordance with the semiconductor device of the fourth aspect, when the differential amplifier turns off the third insulated-gate transistor, the fourth insulated-gate transistor improves an operating certainty of the semiconductor device.

In accordance with the semiconductor device of the fifth aspect, when the second voltage is lower than the voltage supplied from the first power supply, the boost circuit is stopped, and the voltage at the first power supply is dropped to be used as the boost voltage. This reduces current consumption by the voltage increase.

In accordance with the semiconductor device of the sixth aspect, since charge is sequentially transferred to each divided portion of the word line, part of the charge can be used repeatedly for the plurality of portions, reducing power consumption by the word line.

In accordance with the semiconductor device of the seventh aspect, it is possible to omit the wire connecting the electrode regions of the transistors having different conductivity types and adjacent to each other. Thus, power consumption can be reduced by reducing the load capacity.

The object of the present invention is to obtain the stable internal supply voltage by increasing the operating speed of the dc voltage circuit with reduction in the load capacity for driving the differential amplifier, and further to reduce the consumption of current in the dc voltage circuit. The consumption of current in the semiconductor chip can also be reduced by switching a boost voltage generating means in accordance with the external supply voltage or by effectively using a charge in the semiconductor device. Further, the SOI structure reduces a wiring capacity of the semiconductor device, and reduces power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
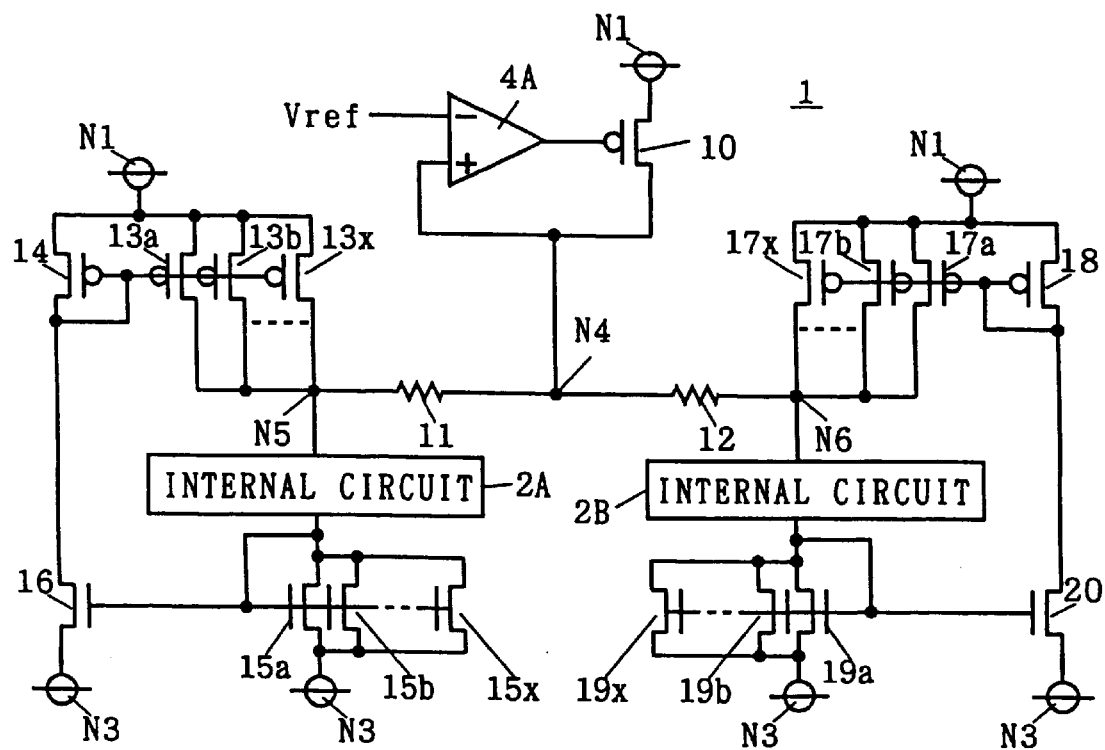
FIG. 1 is a circuit diagram showing a structure of a semiconductor device in accordance with a first preferred embodiment of the present invention.

FIG. 1 shows a structure of the semiconductor device comprising a dc voltage circuit in accordance with a first preferred embodiment of the present invention. The dc voltage circuit of FIG. 1 is formed in a semiconductor chip 1 along with internal circuits 2A and 2B.

The dc voltage circuit of FIG. 1 is comprised of current circuits for supplying a current to the internal circuits 2A and 2B, respectively, and a circuit for supplying the same internal supply voltage to the internal circuits 2A and 2B. To nodes N1 and N3, different external supply voltages are applied, respectively. The voltage applied to the node N3 includes a ground voltage.

The current circuit for supplying a current to the internal circuit 2A is comprised of: a plurality of PMOS transistors 13a through 13x connected between nodes N1 and N5 for supplying the internal supply voltage to the internal circuit 2A; a PMOS transistor 14, having a gate and a drain both connected to gates of the transistors 13a through 13x and a source connected to the node N1, for generating a voltage supplied to the gates of the transistors 13a through 13x; an NMOS transistor 16 having a gate, a source connected to the node N3, and a drain connected to the drain of the transistor 14; and a plurality of NMOS transistors 15a through 15x having a gate connected to the gate of the transistor 16, a drain connected to the gates of the internal circuit 2A and the transistor 16, and a source connected to the node N3.

The current circuit for supplying a current with the internal circuit 2B is comprised of: a plurality of PMOS transistors 17a through 17x connected between the node N1 to which the external supply voltage is applied, and a node N6 for supplying the internal supply voltage to the internal circuit 2B; a PMOS transistor 18 having a gate and a drain both connected to gates of the transistors 17a through 17x to generate a voltage to be applied to the gates of the transistors 17a through 17x, and a source connected to the node N1; an NMOS transistor 20 having a gate, a source connected to the node N3, and a drain connected to the drain of the transistor 18; and a plurality of NMOS transistors 19a through 19x having a gate connected to the gate of the transistor 20, a drain connected to the internal circuit 2B and the gate of the transistor 20, and a source connected to the node N3.

The circuit for supplying the same internal supply voltage to the internal circuits 2A and 2B is comprised of: a PMOS transistor 10 connected between the node N1 to which the external supply voltage is applied, and a node N4; and a differential amplifier 4A having an output terminal connected to the gate of the transistor 10, a non-inverting input terminal connected to the node N4, and an inverting input terminal to which a reference voltage Vref is applied.

There are generally parasitic resistances 11 and 12 between the nodes N5, N6 for directly applying a voltage to the internal circuits 2A, 2B, and the node N4 to which the transistor 10 directly applies a voltage. This is because the internal circuits 2A and 2B can be formed in any location in the semiconductor chip 1, for example in the middle of the semiconductor chip 1, and may be away from the circuit for supplying the internal supply voltage to the internal circuits 2A and 2B.

Requiring no reference voltage Vref, the current circuit for supplying a current to the internal circuit 2A can be formed in any location in the semiconductor chip 1, for example, in the vicinity of the internal circuit 2A. The same positional relationship applies to the internal circuit 2B and the current circuit for supplying a current to the internal circuit 2B.

For example, when operation of the internal circuit 2A causes a current flow to the internal circuit 2A, the same amount of current flowing through the internal circuit 2A flows through the diode-connected transistors 15a through 15x. Since the transistors 15a through 15x and 16 form a current mirror circuit, and the ratio of current between two current paths of the current mirror circuit is set to n:1, the current flowing through the transistor 16 is a fraction of n of the whole current flowing through the transistors 15a through 15x. Further, the transistor 16 is in series with the transistor 14, so that the same amount of current flowing through the transistor 16 flows through the diode-connected transistor 14.

Since the transistors 14 and 13a through 13x form a current mirror circuit, the value of current to be supplied to the internal circuit 2A from the transistors 13a through 13x at an output stage varies in accordance with the value of current flowing through the transistor 14. At this time, if the ratio of current between the two current paths of the current mirror circuit, comprised of the transistors 14 and 13a through 13x, is set to 1:n, the amount of current consumed by the internal circuit 2A is the same with that supplied from the transistors 13a through 13x. The consumed current may not transiently be the same with the supplied current, but would be the same when viewed in a steady-stable condition. For this ratio of current, the current flowing from the transistor 10 through the node N5 would be none or considerably small, and thus the voltages at the nodes N4 and N5 become almost the same. Thus, the voltage applied to the internal circuit 2A can almost be the reference voltage Vref. Further, since little current flows, the capability for driving the transistor 10 can be small, and the transistor 10 can be made so small as to be adaptive to a high-speed operation. The same applies to the internal circuit 2B.

As described above, the consumption of current in the transistors 14 and 16, except in the internal circuits 2A and 2B, can be reduced by differentiating the transistors, forming the current mirror circuit within a closed loop, from each other in size to make the current flowing through one current path not including the internal circuits 2A and 2B smaller than that flowing through the other current path.

<Second Preferred Embodiment>

Figure 2:
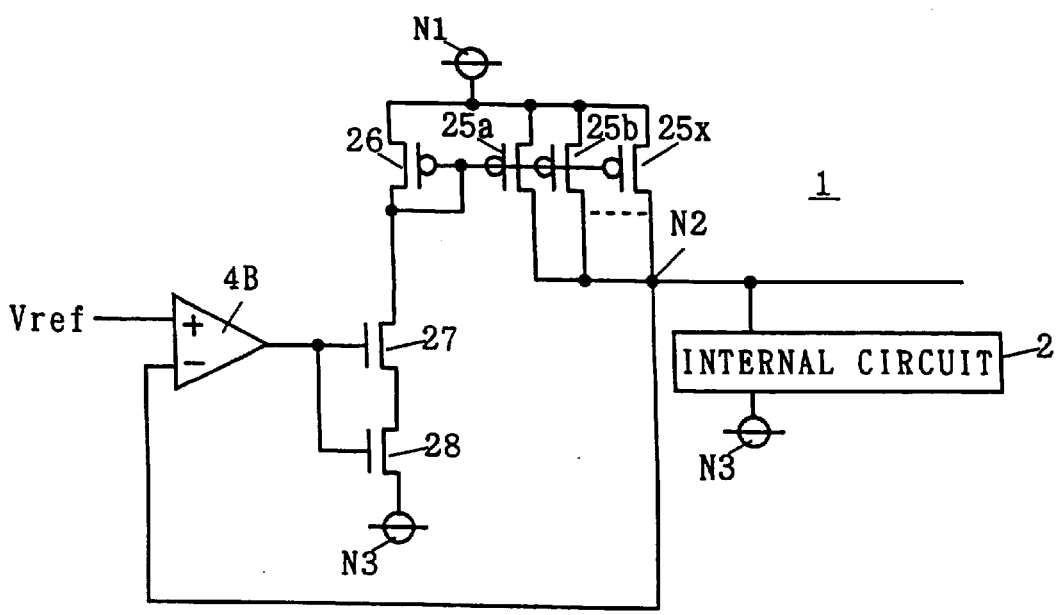
FIG. 2 is a circuit diagram showing a structure of a semiconductor device in accordance with a second preferred embodiment of the present invention.

FIG. 2 shows a structure of the semiconductor device comprising the dc voltage circuit in accordance with a second preferred embodiment of the present invention. The dc voltage circuit of FIG. 2 is formed in the semiconductor chip 1 along with an internal circuit 2.

The dc voltage circuit is comprised of: a plurality of PMOS transistors 25a through 25x connected between the node N1 and a node N2 for supplying the internal supply voltage to the internal circuit 2; a PMOS transistor 26, having a gate and a drain both connected to the gates of the transistors 25a through 25x and a source connected to the node N1, for generating a voltage to be supplied to the gates of the transistors 25a through 25x; an NMOS transistor 27 having a gate, a source, and a drain connected to the drain of the transistor 26; an NMOS transistor 28 having a gate connected to the gate of the transistor 27, a drain connected to the source of the transistor 27, and a source connected to the node N3; and a differential amplifier 4B having an output terminal connected to the gates of the transistors 27 and 28, an inverting input terminal connected to the node N2, and an non-inverting input terminal to which the reference voltage Vref is applied.

The transistors 25a through 25x and 26 form a current mirror circuit, and channel widths of the transistors 25a through 25x are determined so that the sum of the widths becomes larger than the channel width of the transistor 26. For simplicity of explanation, the channel widths of the transistor 26 and n transistors 25a through 25x are all assumed to be the same. Since changes in each current value of the transistors 26 and 25a through 25x are almost the same, the value of current flowing through the node N2 changes n times that the current value of the transistor 26 changes. Required only to change the current value of the transistor 26, the transistors 27 and 28 can be made small. The transistor 27 certainly turns off the current path connected to the transistors 27 and 28 when the output of the differential amplifier 4B becomes low in level. Thus, the gate capacities of the transistors 27 and 28, that is, the load capacities for driving the differential amplifier 4B, can be reduced, and further the internal supply voltage can be stable even with high operation of the internal circuit. This brings about a high-speed operation of the semiconductor device.

<Third Preferred Embodiment>

In the DRAM for setting a boost voltage at a lower level by thinning a gate oxide film, when an operating voltage of the semiconductor chip is the same with or close to the boost voltage in level, the external supply voltage VCC itself or the reduced one is used as the boost voltage VPP.

Figure 3:
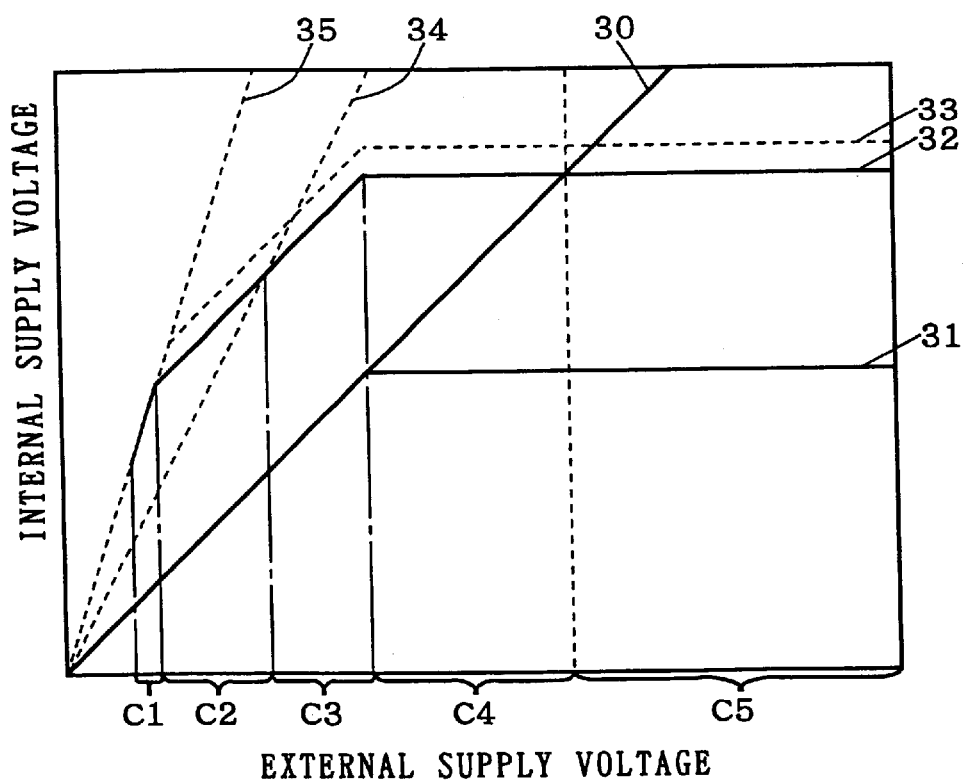
FIG. 3 is a graph showing correlation between operation of the semiconductor device, and an external supply voltage or an internal supply voltage in accordance with a third preferred embodiment of the present invention.
Figure 13:
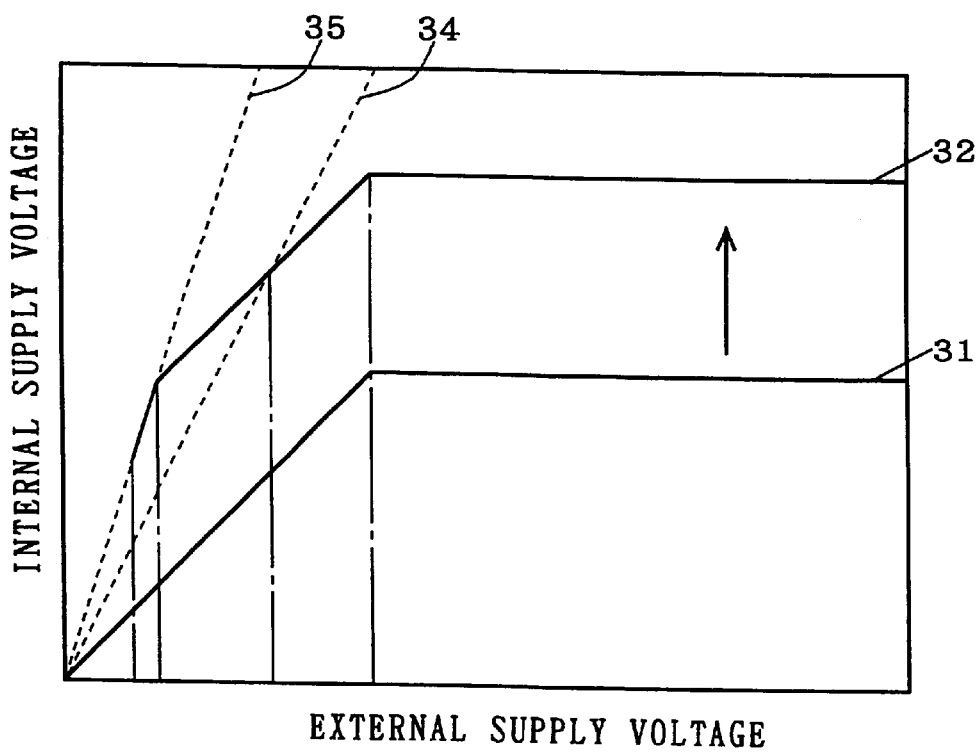
FIG. 13 is a graph showing correlation between the operation of the conventional semiconductor device, and an external supply voltage or an internal supply voltage.

FIG. 3 is a graph showing correlation among the external supply voltage, the internal supply voltage and the boost voltage. In FIG. 3, the solid line with the reference numeral 30 indicates the aggregation of points where the external supply voltage is equal to the internal supply voltage; the dotted line with the reference numeral 33 indicates a voltage which the boost voltage generating circuit is required to generate to obtain the boost voltage VPP; and the other lines correspond to those with the same reference numerals of FIG. 13.

In FIG. 3, the correlation among them is divided into five cases. For description of the DRAM, the internal supply voltage is assumed to be a voltage for operating the DRAM, called an array operating voltage.

A case C1 is when the external supply voltage is lower than the array operating voltage, and the boost voltage cannot be supplied even by a 3VCC type charge pump for generating the voltage three times the external supply voltage A case C2 is when the external supply voltage is lower than the array operating voltage, and the boost voltage can be supplied by the 3VCC type charge pump. A case C3 is when the array operating voltage is determined by the external supply voltage, and the boost voltage can be supplied by a 2VCC type charge pump for generating the voltage two times the external supply voltage. A case C4 is when the external supply voltage is higher than the array operating voltage but lower than the boost voltage, and the boost voltage can be supplied by the 2VCC type charge pump. A case C5 is when the external supply voltage is higher than both the array operating voltage and the boost voltage.

Described in detail is a structure of the dc voltage circuit for generating the boost voltage in an appropriate way with regard to the external supply voltages provided in the cases C2 through C5. A node N10 corresponds to an output terminal of the boost voltage VPP. A circuit CR1 comprised of a differential amplifier 40, transistors 41 and 43 through 45, and a buffer 42, operates in the case C5 to generate the boost voltage by reducing the external supply voltage. The different external supply voltages are applied to the nodes N1 and N3 in this circuit.

The voltage at the node N10 is applied through a PMOS transistor 45 to the non-inverting input terminal of the differential amplifier 40, while the reference voltage Vref is applied to the inverting input terminal of the differential amplifier 40. In this case, the reference voltage Vref is assumed to be the same with the internal supply voltage. The transistor 45 is diode-connected. The voltage applied to the non-inverting input terminal of the differential amplifier 40 is lower than the voltage at the node N10 by the voltage drop in the transistor 45, the difference of which indicates the difference between the internal supply voltage and the boost voltage VPP. The output of the differential amplifier 40 is applied via the gate of the transistor 41 and the buffer 42 to the gate of the transistor 43. The voltage at the node N11, determined by the outputs of the transistors 41 and 43, is higher than the voltage at the node N10 by a threshold voltage of the transistor 44 connected between the nodes N10 and N11. One end of a constant current source 46 is connected via the transistor 45 to the node N10, and the other end is connected to the node N3. The transistors 44 and 45 are diodes for blocking current in the opposite direction. Since the external supply voltage is used as the boost voltage without any increase, it is possible to reduce consumption of current necessary for a boost in voltage in the circuit CR1. Further, if the voltage at the node N10 becomes higher than the voltage at the node N1, the circuit CR1 would not generate the boost voltage.

A circuit CR2 comprised of a comparator 50, a voltage adjusting circuit 51, a ring oscillator 53, the 2VCC type charge pump 54, and a transistor 55, operates in the cases C3 and C4 to generate the voltage two times the external supply voltage to be used as the boost voltage.

The voltage at the node N10 is applied via the transistor 45 to the inverting input terminal of the comparator 50, while the reference voltage Vref is applied to the non-inverting input terminal of the comparator 50. The output of the comparator 50 is provided via the buffer 52 to the ring oscillator 53, and, when the voltage at the node N10 becomes lower than a predetermined value (reference voltage Vref+voltage drop of the transistor 45), the ring oscillator starts to operate. The voltage adjusting circuit 51 judges the difference between the boost voltage and the predetermined value obtained from the output of the comparator 50, and changes the operating speed of the ring oscillator 53 in accordance with the degree of the difference. The increase in the operating speed of the ring oscillator increases the capability of the charge pump 54. The output of the charge pump 54 is applied via the transistor 55 to the node N10.

A circuit CR3 comprised of a maximum-frequency detecting circuit 56, a ring oscillator 57, and the 3VCC type charge pump 58, operates in the cases C1 and C2, accompanied with the circuit CR2, and generates the voltage three times the external supply voltage to be used as the boost voltage when the desired boost voltage cannot be obtained even with the voltage two times the external supply voltage.

The maximum-frequency detecting circuit 56 observes an output voltage of the voltage adjusting circuit 51 to detect when the operating speed of the ring oscillator 53 reaches a maximum. The maximum operating speed of the ring oscillator 53 indicates that the desired boost voltage cannot be obtained within the capability of the charge pump 54, so that it becomes necessary to operate the 3VCC type charge pump 58. Detecting the maximum frequency, the maximum-frequency detecting circuit 56 operates the ring oscillator 57 to supply the boost voltage from the 3VCC type charge pump 58. Since the ring oscillator 57 performs turn-on or turn-off operations in accordance with the output of the comparator 50, the desired boost voltage can be obtained.

Further, the 2VCC type charge pump 54 and the 3VCC type charge pump 58 may use a common ring oscillator, instead of the ring oscillators 53 and 57 used respectively in the third preferred embodiment.

Figure 4:
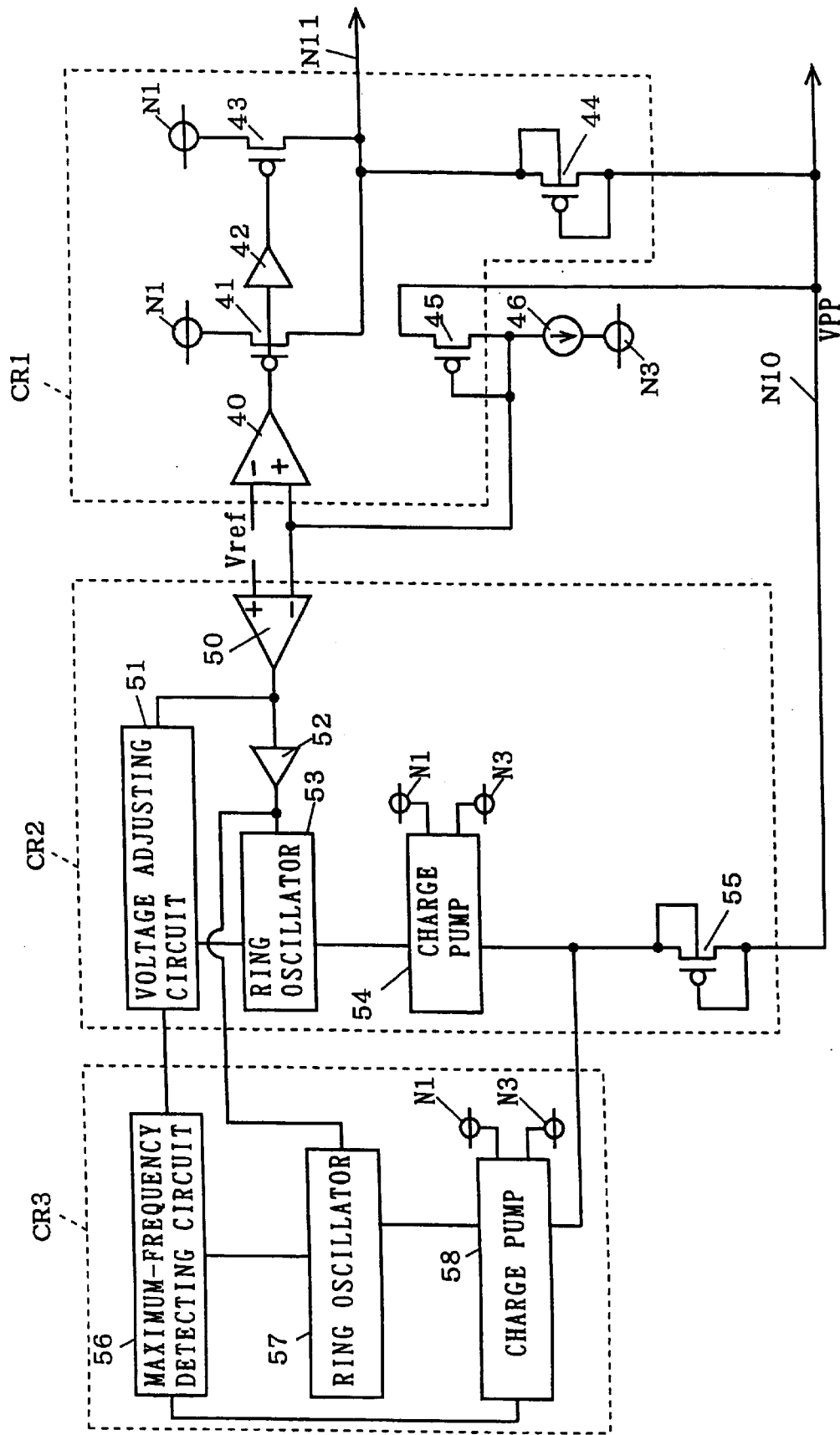
FIG. 4 is a block diagram showing a structure of the semiconductor device in accordance with the third preferred embodiment.
Figure 5:
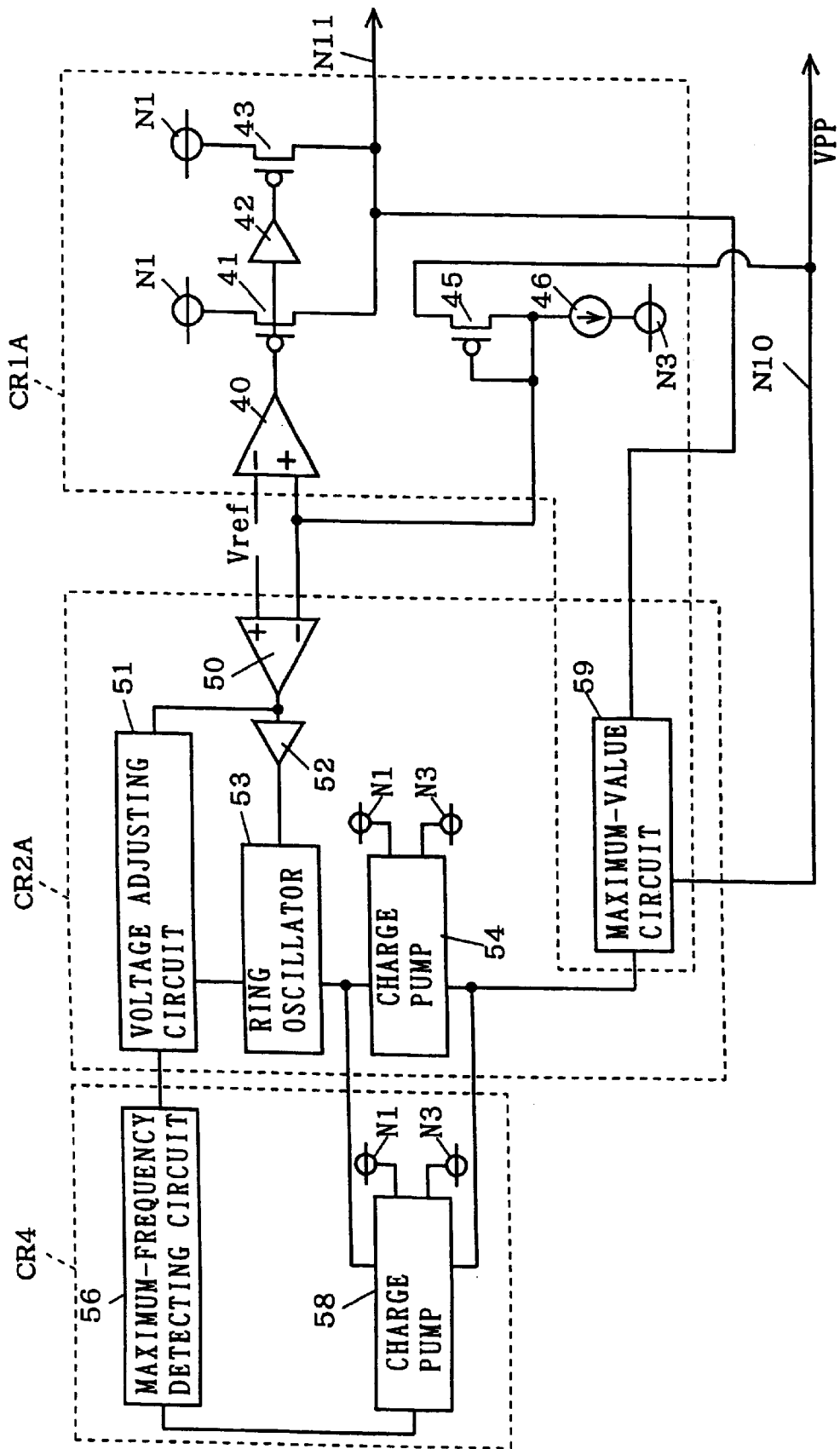
FIG. 5 is a block diagram showing another structure of the semiconductor device in accordance with the third preferred embodiment.

FIG. 5, for example, shows that one ring oscillator 53 supplies a voltage to the charge pumps 54 and 58. In this case, the 3VCC type charge pump 58 outputs a voltage in accordance with the frequency of a signal transmitted from the ring oscillator 53, and turns on or off in accordance with the output of the maximum-frequency detecting circuit 56. Thus, compared to the circuit CR3 of FIG. 4, elimination of one ring oscillator simplifies the circuit CR4 which generates the voltage three times the external supply voltage to be used as the boost voltage when the desired boost voltage cannot be obtained even with the voltage two times the external supply voltage.

Figure 6:
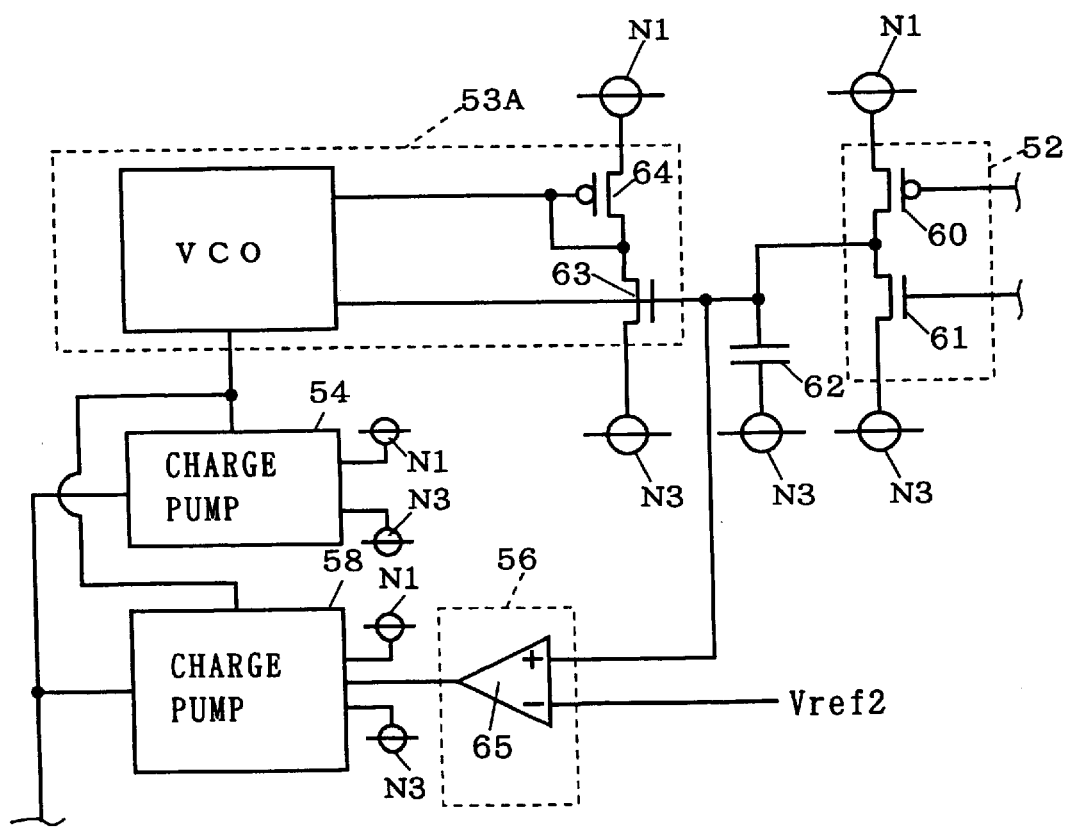
FIG. 6 is a circuit diagram showing a detailed structure of the semiconductor device of FIG. 5.

FIG. 6 shows a circuit diagram at the stage from the output of the comparator 50 of FIG. 5 to a maximum-value circuit 59. The buffer 52 comprises CMOS transistors 60 and 61, and the output of the comparator 50 is provided to the gates of those transistors. The voltage adjusting circuit 51 comprises a capacitor 62 one electrode of which is connected to the node N3, and generates a voltage at the other electrode of the capacitor 62 in accordance with the charge supplied from the transistors 60 and 61 of the buffer 52 to the capacitor 62. This voltage is applied to an oscillator. The oscillator in this case may be, for example, a voltage controlled oscillator 53A instead of the ring oscillator 53. The oscillating frequency of the voltage controlled oscillator 53A is changed by changing the current flowing through transistors 63 and 64 of the voltage controlled oscillator 53A. The maximum-frequency detecting circuit 56 comprises a comparator 65 for comparing a reference voltage Vref2 with the voltage at the other electrode of the capacitor 62. When the voltage does not reach the desired value in spite of the oscillation of the voltage controlled oscillator 53A and the maximum output of the charge pump 54, a comparator 65 produces an output to operate the 3VCC type charge pump 58.

Moreover, the circuits CR1A and CR2A of FIG. 5 comprise the maximum-value circuit 59 instead of the transistors 44 and 55 of FIG. 4. The maximum-value circuit 59 selects and outputs a larger value out of the outputs of the transistors 41, 43 and the charge pumps 54, 58. Since the maximum-value circuit 59 detects a line outputting the maximum value, and switches a connection to output a value from the line, voltage drop in the boost voltage by the threshold voltage can be prevented as in the case using the diode.

<Fourth Preferred Embodiment>

To suppress power consumption, it is required to reduce a charging/discharging current in the semiconductor device comprising the memory cell, especially to reduce a charging/discharging current of a word line using a high voltage in the semiconductor device comprising the DRAM. In the dc voltage circuit for supplying a high voltage as described in the third preferred embodiment, further suppression of power consumption is possible depending on the structure of the device used in the circuit.

Figure 7:
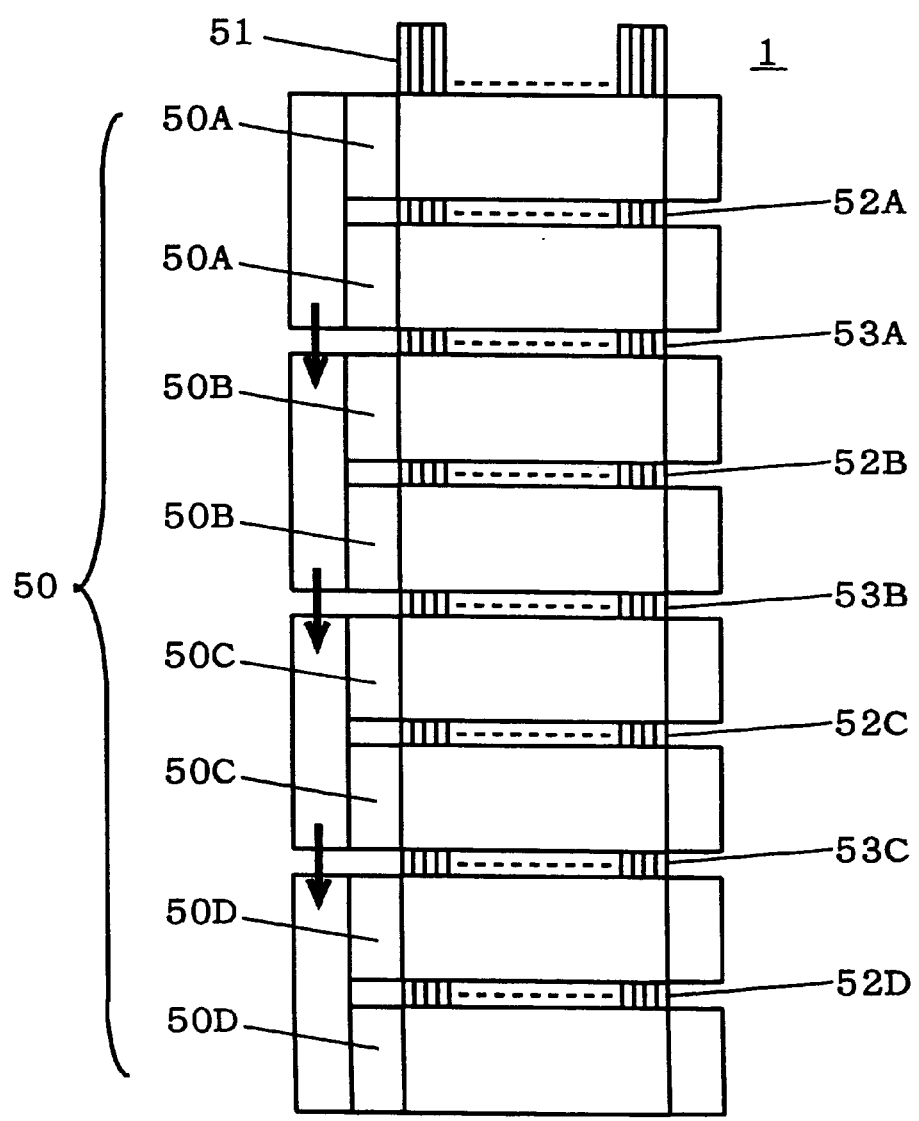
FIG. 7 is a block diagram showing a structure of a semiconductor device in accordance with a fourth preferred embodiment of the present invention.

FIG. 7 is a block diagram showing the structure of the semiconductor device in accordance with a fourth preferred embodiment of the present invention. This semiconductor device comprises a memory cell array 50 to be a device in the semiconductor chip 1.

The memory cell array 50 is divided into a plurality of blocks 50A through 50D, and then a row decoder 51 common to all the blocks 50A through 50D is deposited in the memory cell array 50. In the blocks 50A through 59D, word line drivers 52A through 52D are deposited, respectively. Further, transfer gates 53A through 53C are arranged between the blocks 50A and 50B, between the blocks 50B and 50C, and between the blocks 50C and 50D, respectively.

Figure 8:
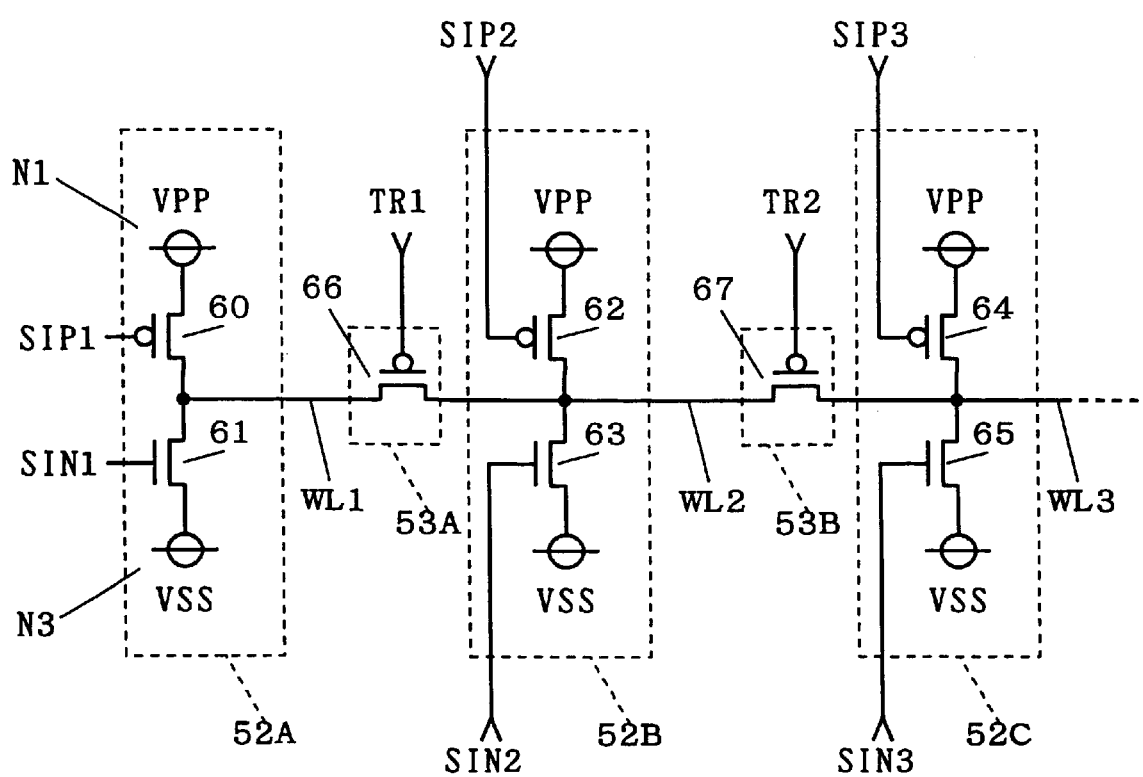
FIG. 8 is a circuit diagram showing a structure around a word line of the semiconductor device of FIG. 7.

FIG. 8 generally shows a structure in the vicinity of the word line of the memory cell array 50 shown in FIG. 7. Each of the word line drivers 52A through 52C of FIG. 7 comprises one PMOS transistor and one NMOS transistor. When a signal SIP1 supplied to the gate of the PMOS transistor 60 is at a low level, the PMOS transistor 60 of the word line driver 52A supplies the boost voltage VPP to a word line portion WL1. Further, when a signal SIN1 supplied to the gate of the transistor 61 is at a high level, the NMOS transistor 61 of the word line driver 52A connects the word line portion WL1 to the node N3. Similarly, a word line portion WL2 is connected to the PMOS transistors 62 and the NMOS transistors 63 of the word driver 52B, and a word line WL3 to the PMOS transistors 64 and the NMOS transistors 65 of the word driver 53B. Thus, when signals SIP2 and SIP3 supplied to the gates of the transistors 62 and 64 are at a low level, the boost voltage VPP is supplied to the word line portions WL2 and WL3; when signals SIN2 and SIN3 supplied to the gates of the transistors 63 and 65 are at a high level, the word line portions WL2 and WL3 are connected to the node N3.

The word line portion WL1 is arranged in the block 50A. The transfer gate 53A comprises a PMOS transistor 66 connected between the word line 15 portions WL1 and WL2. When a signal TR1 supplied to the gate of the transistor 66 is at a low level, the word line portions WL1 and WL2 are connected with each other; when at a high level, they are disconnected from each other. Similarly, the word line portions WL2 and WL3 are arranged in the blocks 50B and 50C, respectively. The transfer gate 53B comprises a PMOS transistor 67 connected between the word line portions WL2 and WL3. When a signal TR2 supplied to the gate of the transistor 67 is at a low level, the word line portions WL2 and WL3 are connected with each other; when at a high level, they are disconnected from each other.

Figure 9:
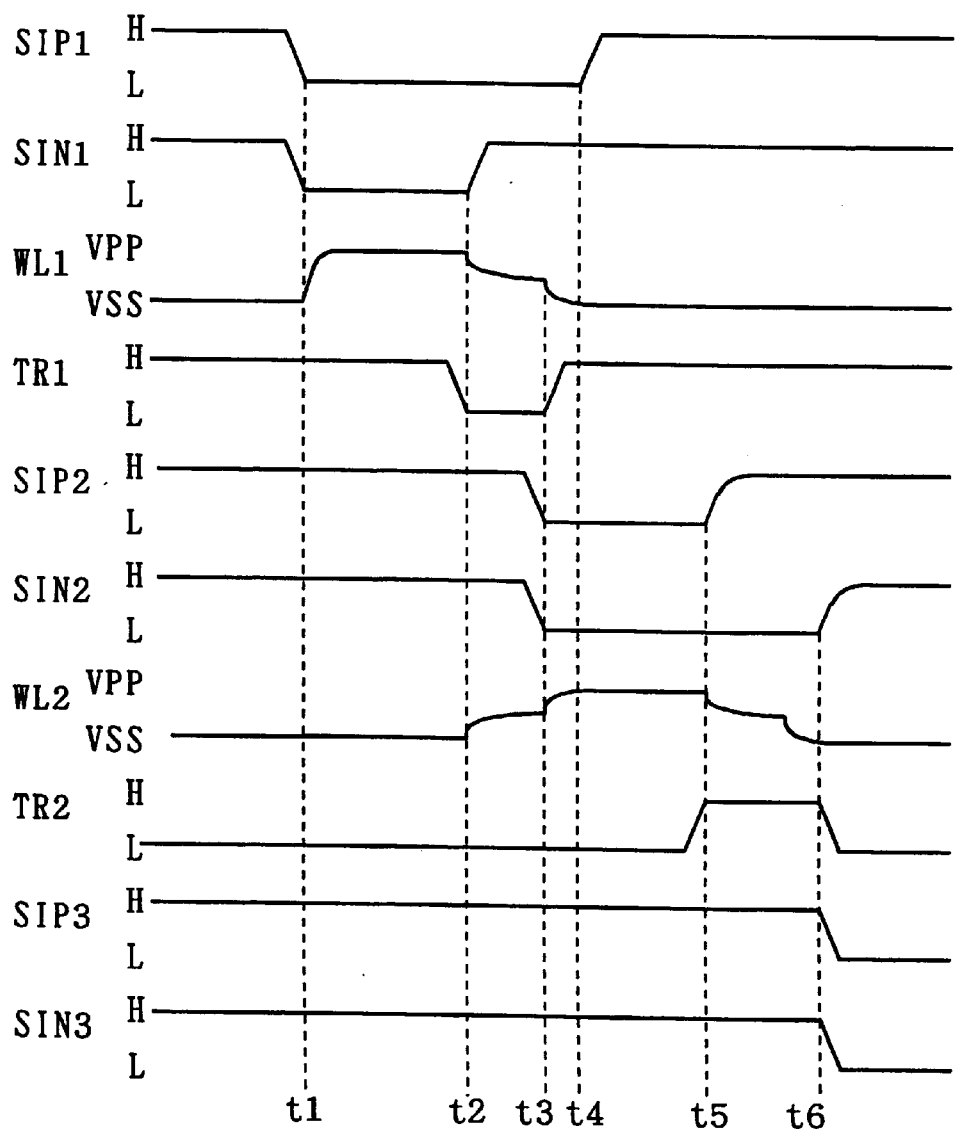
FIG. 9 is a timing chart illustrating the operation of the semiconductor device of FIG. 7.

FIG. 9 is a timing chart showing the operation of the memory cell array shown in FIGS. 7 and 8. When both of the signals SIP1 and SIN1 become low in level at a time t1 the boost voltage VPP is supplied to the word portion WL1. Since the signal TR1 is at a high level at this time, the capacity of the word line portion WL1 disconnected from the word line portion WL2 is small, reducing a charge to be supplied by the transistor 60. Then, data is read out or written by using the word line portion WL1 obtaining the boost voltage VPP. At a time t2, the signal SIP1 becomes high in level, and the word line driver 52A is disconnected from the word line portion WL1. At that time, the signal TR1 is set to low in level to connect the word line portions WL1 and WL2.

At a time t3, the signal TR1 is set to high in level to disconnect again the word line portion WL1 from WL2, and then the signals SIP2 and SIN2 are both set to low to supply the boost voltage VPP via the transistor 62 to the word line portion WL2. At this time, the potential in the word line portion WL2 has been increased to a certain degree because the word line portion WL2 has been connected to the boosted word line portion WL1, receiving the supply of charge. This reduces the charge to be supplied via the transistor 62 to the word line portion WL2 in order to apply the boost voltage VPP to the word line portion WL2. At a time t4, the signal SIN1 is set to high in level to connect the word line portion WL1 to the node N3. At times t5 and t6, the signals SIP2, SIN2 and TR2 are changed so that a charge is transmitted from the word line portion WL2 to the word line portion WL3 by the transfer gate 53B.

As described above, power consumption can be suppressed by dividing a time every blocks 50A through 50D of the memory cell array 50 to read or write data, and transmitting a charge between the word line portions WL1 through WL3 connected to the blocks 50A through 50D, respectively.

<Fifth Preferred Embodiment>

Figure 10:
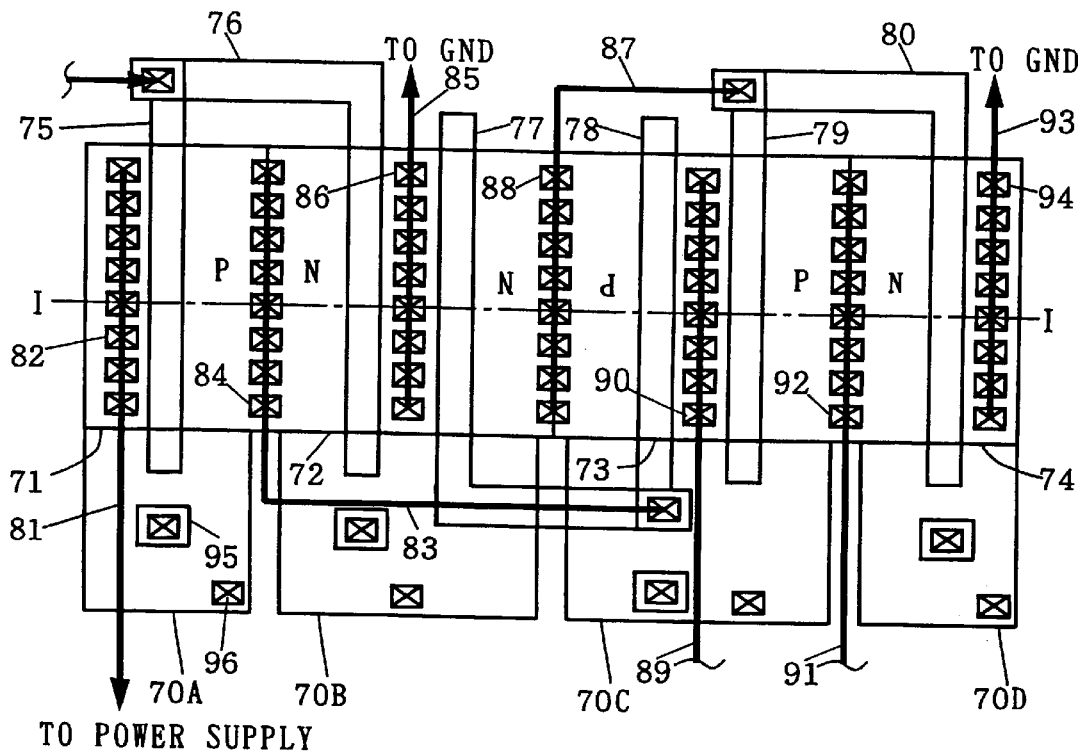
FIG. 10 shows a layout of a semiconductor device in accordance with a fifth preferred embodiment of the present invention.

While the fourth preferred embodiment ensures reduction in power consumption by transmitting a charge to the divided word lines, a fifth preferred embodiment of the present invention proposes to reduce power consumption by reducing the length of wires for connecting devices in order to reduce the capacity of those devices. Such a structure will be described with reference to FIG. 10. FIG. 10 is a layout of an inverter in accordance with a fifth preferred embodiment of the present invention. To reduce power consumption, the inverter has the SOI structure in which sources or drains of the MOS transistors of different conductivity types are connected adjacent to each other to eliminate a wire between electrodes.

Figure 11:
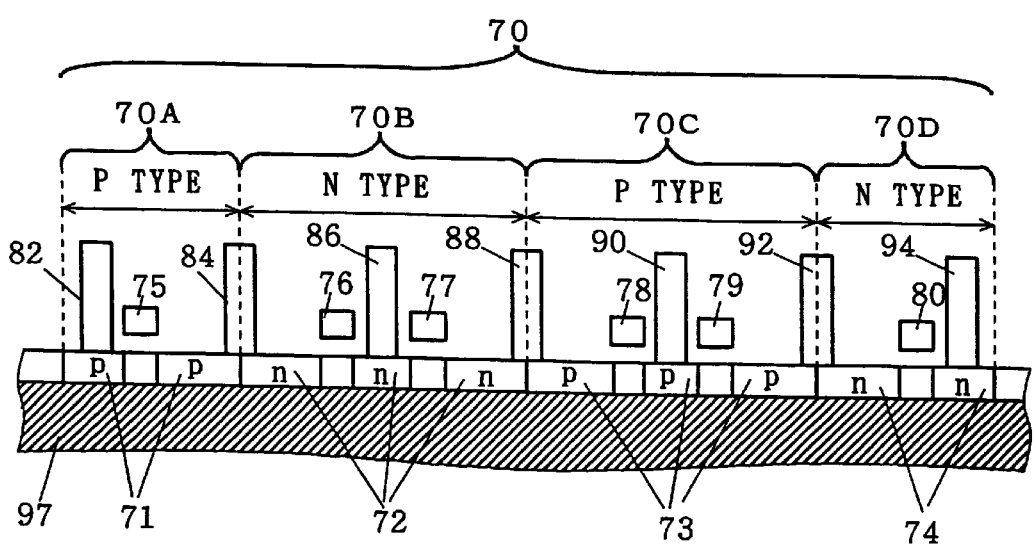
FIG. 11 is a sectional view taken along a line I—I of FIG. 10.
Figure 12:
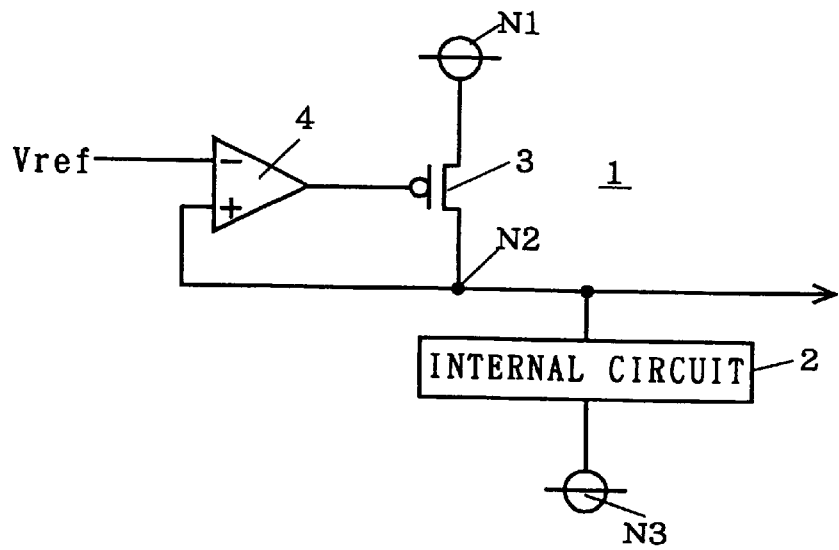
FIG. 12 is a circuit diagram showing a conventional semiconductor device.

In FIG. 10, the reference characters 70A through 70D indicate well regions; 71 and 73 indicate P-type impurity diffusion regions; 72 and 74 indicate N-type impurity diffusion regions; 75 indicates an electrode forming a PMOS transistor along with the diffusion region 71; 76 and 77 indicate gate electrodes forming two NMOS transistors having the common source electrode, along with the diffusion region 72; 78 and 79 indicate gate electrodes forming two PMOS transistors having the common source electrode, along with the diffusion region 74; 80 indicates a gate electrode forming an NMOS transistor along with the diffusion region 74; 81 indicates a wire for connecting the source of a transistor having the gate electrode 75, with the power supply; 82 indicates a contact for connecting the wire 81 with the source of a transistor having the gate electrode 75; 83 indicates a wire for connecting the drain of a transistor having the gate electrodes 75 and 76 with the gate electrodes 77 and 78; 84 indicates a contact for connecting the wire 83 simultaneously with two drains of transistors having the gate electrodes 75 and 76; 85 indicates a wire for connecting the source of a transistor having the gate electrode 76 with the ground; 86 indicates a contact for connecting the wire 85 with the source of a transistor having the gate electrode 76; 87 indicates a wire for connecting the drain of a transistor having the gate electrodes 77 and 78 with the gate electrodes 79 and 80; 88 indicates a contact for connecting the wire 87 simultaneously with two drains of transistors having the gate electrodes 77 and 78; 89 indicates a wire for connecting the source of a transistor having the gate electrodes 78 and 79 with the power supply; 90 indicates a contact for connecting the wire 89 simultaneously with two sources of transistors having the gate electrodes 78 and 79; 91 indicates a wire for outputting a signal from the drain of a transistor having the gate electrodes 79 and 80; 92 indicates a contact for connecting the wire 91 simultaneously with two drains of transistors having the gate electrodes 79 and 80; 93 indicates a wire for connecting the source of a transistor having the gate electrode 80 with the ground (node N3); 94 indicates a contact for connecting the wire 93 with the source of a transistor having the gate electrode 80; 95 indicates a body contact for making a connection with the substrate; and 96 indicates a field shield contact. FIG. 11 is a sectional view taken along a line I—I of FIG. 10. In FIG. 11, the reference numeral 97 indicates an insulator, such as a silicon oxide film, arranged under an epitaxial layer; and the other reference numerals correspond to the same reference numerals of FIG. 10.

As is obvious from FIG. 11, only a shallow impurity implantation may be necessary to form the well regions 70A through 70D. Thus, the well regions in the transistors of the different conductivity types, for example, the well regions 70A and 70B, or 70B and 70C, can be formed adjacent to each other, so that the sources or the drains of the transistors of different conductivity types can also be formed adjacent to each other. In this case, it is desirable to form the sources or the drains of the transistors of different conductivity types close to each other. For the inverter shown in FIG. 10, for example, a wire for connecting the drains of the MOS transistors forming the inverter becomes unnecessary, reducing the load on the inverter and power consumption.

While the invention has been described in detail, the foregoing description is in all aspects illustrative and not restrictive. It is understood that numerous other modifications and variations can be devised without departing from the scope of the invention.

I claim:

1. A semiconductor device comprising:
   a memory cell array having a plurality of blocks and a plurality of word lines comprised of a plurality of portions divided for each of said plurality of blocks to select memory cells of said plurality of blocks;
   a row decoder for selecting a row to select said word line;
   an individual word line driver provided for each of said plurality of blocks to supply a predetermined voltage to said portion; and
   an individual transfer gate provided between each of said plurality of portions to connect said plurality of portions, wherein data is read from or written to a row selected by said row decoder by transferring a charge between said plurality of portions adjacent to each other, in accordance with continuity or non-continuity of said transfer gate for said plurality of blocks in said memory cell array.

2. The semiconductor device as set forth in claim 1, wherein said word line driver comprises:

a first MOS transistor having a drain connected to a corresponding portion of said word line, a source connected to a first power supply, and a gate receiving a first signal; and a second MOS transistor having a drain connected to said drain of said first MOS transistor, a source connected to a second power supply, and a gate receiving a second signal.

3. The semiconductor devices as set forth in claim 1, wherein each of said transfer gate is comprised of one MOS transistor.

* * * * *